United States Patent
Saurel et al.

(10) Patent No.: US 10,466,374 B2
(45) Date of Patent: Nov. 5, 2019

(54) METHOD FOR QUANTIFYING THE INTRINSIC DIMENSIONS OF RADIATION SENSORS, PARTICULARLY IONIZING RADIATION SENSORS, AND DEVICE FOR IMPLEMENTING SAME

(71) Applicant: COMMISSARIAT A L'ENERGIE ATOMIQUE ET AUX ENERGIES ALTERNATIVES, Paris (FR)

(72) Inventors: Nicolas Saurel, Varois-et-Chaignot (FR); Nicolas Guillot, Cressanges (FR)

(73) Assignee: COMMISSARIAT A L'ENERGIE ATOMIQUE ET AUX ENERIGES ALTERNATIVES, Paris (FR)

( * ) Notice: Subject to any disclaimer, the term of this patent is extended or adjusted under 35 U.S.C. 154(b) by 0 days.

(21) Appl. No.: 15/551,193

(22) PCT Filed: Feb. 17, 2016

(86) PCT No.: PCT/EP2016/053319
§ 371 (c)(1),
(2) Date: Aug. 15, 2017

(87) PCT Pub. No.: WO2016/131852
PCT Pub. Date: Aug. 25, 2016

(65) Prior Publication Data
US 2018/0024259 A1 Jan. 25, 2018

(30) Foreign Application Priority Data
Feb. 19, 2015 (FR) ..................................... 15 51427

(51) Int. Cl.
*G01T 7/00* (2006.01)
*H01L 31/02* (2006.01)
(Continued)

(52) U.S. Cl.
CPC ................ *G01T 7/005* (2013.01); *G01T 1/36* (2013.01); *H01L 31/02016* (2013.01); *H01L 27/0203* (2013.01); *H01L 27/0207* (2013.01)

(58) Field of Classification Search
CPC ..... G01T 7/005; G01T 1/36; H01L 31/02016; H01L 27/0203
See application file for complete search history.

(56) References Cited

U.S. PATENT DOCUMENTS 8,759,768 B2    6/2014  Hupont et al.
9,158,011 B2   10/2015  Saurel

FOREIGN PATENT DOCUMENTS

WO    WO 98/39628 A2     9/1998
WO    WO 2014/085081 A1  6/2014

OTHER PUBLICATIONS

Venkataraman et al., "Improved detector response characterization method in ISOCS and LabSOCS", Journal of Radioanalytical and Nuclear Chemistry, vol. 264, No. 1, XP019251919, pp. 213-219. (Year: 2005).*

(Continued)

*Primary Examiner* — Michael C Bryant
(74) *Attorney, Agent, or Firm* — Oblon, McClelland, Maier & Neustadt, L.L.P.

(57) ABSTRACT

A method for quantifying intrinsic dimensions of radiation sensors, particularly ionizing radiation sensors, and a device for implementing the method. The method for quantifying the intrinsic dimensions of a radiation sensor includes: defining and modeling the sensor using a schematic diagram of the sensor, determining via numerical computation and via experimental design theory elements that affect the sensor, measuring various specific spatial positions around the sensor, via a multi-frequency calibration source of the (Continued)

radiation, and designing, via experimental design theory, the elements that affect a response of the sensor.

9 Claims, 4 Drawing Sheets (51) Int. Cl.
    *G01T 1/36*     (2006.01)
    *H01L 27/02*     (2006.01)

(56) References Cited

OTHER PUBLICATIONS

Williamson, Martin Rodney, "Multivariate Optimization of Neutron Detectors Through Modeling", PhD diss., University of Tennessee, 2010. <http://trace.tennessee.edu/utk_graddiss/924> accessed Aug. 24, 2018. (Year: 2010).*

U.S. Appl. No. 15/113,370, filed Jul. 21, 2016, US20170003400A1, Cedric Carasco et al.

International Search Report dated May 11, 2016 in PCT/EP2016/053319 (with English translation).

Search Report dated Dec. 17, 2015 in French Patent Application No. 1551427 (with English translation of categories of cited documents).

R. Venkataraman et al., °Improved detector response characterization method in ISOCS and LabSOCS°, Journal of Radioanalytical and Nuclear Chemistry, vol. 264, No. 1, XP019251919, 2005, pp. 213-219.

R. Venkataraman et al., "Validation of in situ object counting system (ISOCS) mathematical efficiency calibration software", Nuclear Instruments & Methods in Physics Research, Section A, vol. 422, XP004161875, 1999, pp. 450-454.

F. L. Bronson et al., "Validation of the MCNP Monte Carlo Code for Germanium Detector Gamma Efficiency Calibrations", Canberra Industries, Feb. 28, 1996, pp. 1-10 (with cover page).

"Standard Test Methods for Detector Calibration and Analysis of Radionuclides", ASTM International, E181-10, 2010, pp. 1-21.

"Model S573/S574 ISOCS/LabSOCS", Validation & Verification Manual, V4.0, 9231205E, 2002, 174 pages.

"ISOCS/LabSOCS, Detector Characterization Report", ACK # 0402896, Detector S/N B05021, Nov. 3, 2004, 62 pages.

"MCNPX™ User's Manual", LANL, Version 2.5.0, Apr. 2005, 462 pages.

"WinnerTrack", ITECH Instruments User's Manual, 2009, pp. 1-35.

* cited by examiner

METHOD FOR QUANTIFYING THE INTRINSIC DIMENSIONS OF RADIATION SENSORS, PARTICULARLY IONIZING RADIATION SENSORS, AND DEVICE FOR IMPLEMENTING SAME

TECHNICAL DOMAIN

This invention relates to a method for quantification of the intrinsic dimensions of radiation sensors, and a device for implementing this method.

The device can determine dimensions of elements of the sensor so that the equivalent digital model predicting the experimental response of this sensor can be defined, and the invention can (a) easily perform this type of dimensioning without any major assumptions about the intrinsic characteristics of the sensor and only from block diagrams of the sensor, (b) provide the accuracy associated with this dimensioning relative to the real response of the sensor and (c) automate these operations. It should also be noted that this device uses a device for measuring the response of the sensor, carrying a radiation emission source with various frequencies and therefore various energies, so that the required unknown dimensions of the sensor can be adjusted making use of a specific process.

The invention is particularly applicable to the metrology of radiation spectrometers. Due to its characteristics, the application domain of the device includes all spectrometric sensors that are intended for non-destructive testing and for which the response and the transport of the associated radiation can be digitized or calculated. Therefore this applies to spectrometers for the measurement of ionizing radiation such as for example gamma, alpha, ultraviolet, infrared, visible light spectrometers and therefore all photography systems. We will then focus on ionizing radiation sensors and more particularly hyper-pure germanium sensors, but the principle of the invention can easily be extended to any other radiation sensor for which the response can be digitized.

STATE OF PRIOR ART

The intrinsic dimensions of a radiation sensor must be known so that its response can be determined, when it is required to digitize the response of this sensor.

Figure 1:
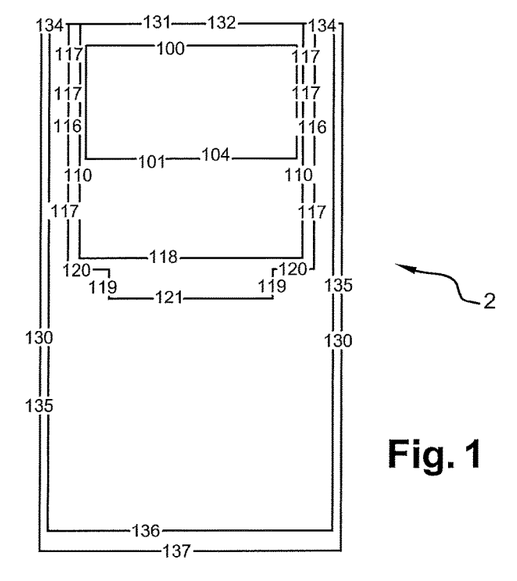
FIG. 1 diagrammatically illustrates an example of a digital model of an ionizing radiation sensor, and has already been described, FIG. 2 diagrammatically illustrates the components of an example of a hyper-pure germanium sensor, and has already been described, FIGS. 3A et 3B represent X-ray images of two examples of hyper-pure germanium sensors, and have already been described, FIG. 4 diagrammatically illustrates an example of a dimensioned diagram of an ionizing radiation sensor.

Modelling the sensor makes it possible to calculate the calibration coefficient(s) useful for quantification of the required magnitude, for example the radiological activity, for each frequency and therefore for all energies of the spectrum of the validity range of an ionizing radiation sensor, for each measurement configuration. Modelling consists of creating a geometric representation of the sensor in a computer program. One example of such a representation is given purely for information and in no way limitatively, on FIG. 1 in the appended drawings, in which the sensor is marked as reference 2. The various numbers that can be seen on this figure represent the numbers of surfaces that delimit the different digitized volumes forming the sensor.

This method is well known. Information about this method can be found particularly in the following documents:

[1] WO 98/39628, F. Bronson et al., Calibration method for radiation spectroscopy

[2] F. Bronson et al., Validation of the MCNP Monte Carlo Code for germanium detector gamma efficiency calibrations, Canberra Industries, U.S.A., 1996

[3] R. Venkataraman et al., Improved detector response characterization method in ISOCS and LabSOCS, Journal of Rad. Nucl. Chem., vol. 264, pp. 213-219, 2005.

However this known method is difficult to implement and requires special know how.

Quantification of intrinsic dimensions that influence the response of the sensor is currently based on precise knowledge of the dimensions of the different elements from which this sensor is made. However, this quantification is difficult because the sensor has a large number of components and some dimensions cannot be measured with sufficient precision to correctly reproduce the effect produced on the sensor response. Thus, digitization of the sensor remains difficult, it requires extensive feedback from experience and is unaffected by calibration errors.

It is now worth mentioning that this invention intends to solve these problems by simplifying the technique used to obtain the equivalent digital model of the sensor, by reinforcing the robustness of this technique and automating it.

The invention is applicable particularly to any type of ionizing radiation measurement spectrometer.

The application field of the dimensioning type considered in the invention relates to non-destructive testing by emission of radiation, and more particularly, digital modelling of ionizing radiation sensors. This modelling then provides a means of using an appropriate computer program to calculate the calibration coefficient to be applied for quantification of the required magnitude, for example the radiological activity.

Note also that obtaining dimensions according to the invention will make it possible to use any required computer program, and even to compare the responses of several computer programs.

The measurement of the intensity of a radiation source is based on creating the correspondence between the number of radiation events emitted per unit time and the number of these radiation events recorded and actually declared by the spectrometer used to measure them. This correspondence is called the "detection efficiency". This term will be used through the remainder of the description. The fact of have a spectral sensor makes it possible to separate several frequencies and therefore several energies, and to make an intensity measurement for each of them. This technique has been used in the field of non-destructive testing for several decades and is broadly standardised. For example, information about this subject can be found in the following document:

[4] Standard test methods for detector calibration and analysis of radionuclides, ASTM international, E181-10.

Figure 2:
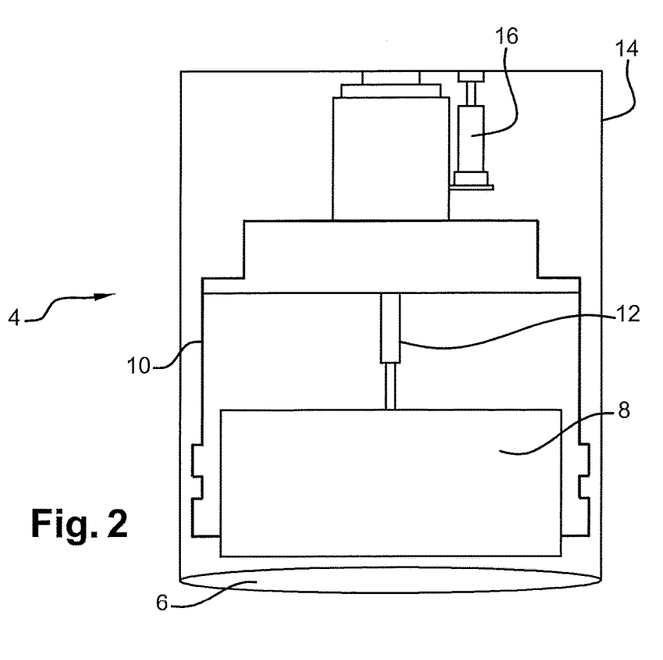

Judicious integration of the sensor geometry into a radiation or particle transport calculation program that has been validated provides a means of digitally quantifying calibration coefficients, without the use of experimental standards. FIG. 2 in the appended drawings shows the components of an example of a hyper-pure germanium sensor 4.

On this figure, references 6, 8, 10, 12, 14 and 16 represent a carbon epoxy input window, a hyper-pure germanium crystal, a support, a central contact, a cover and a preamplifier kept at low temperature, respectively.

In prior art, the geometry of the sensor is integrated into the computer code by reconstituting the elements of the sensor as precisely as possible, making use of all available data. The first data used are dimensions that are directly recorded on the different elements before assembly (cover, input window, support, etc.) and that are supplied by the manufacturer (see document [1]). All these dimensions are sufficient to model the sensor. However, significant differences can occur between supplied data and reality, especially when the manufacturer is not the supplier of the sensor geometry (see document [2]).

Figure 3A:
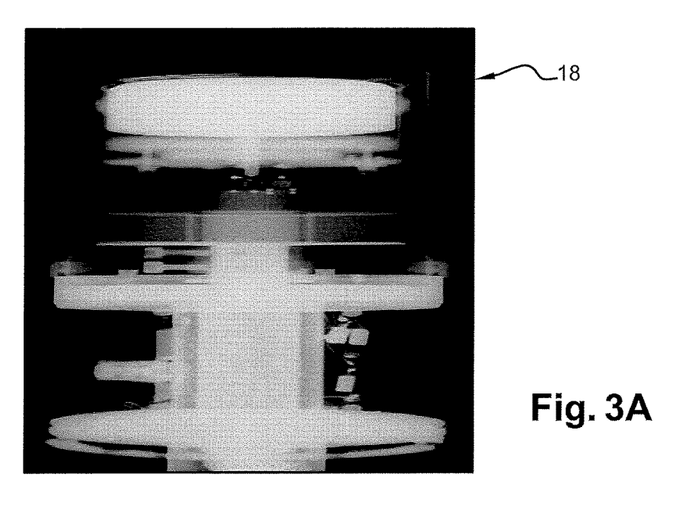
Figure 3B:
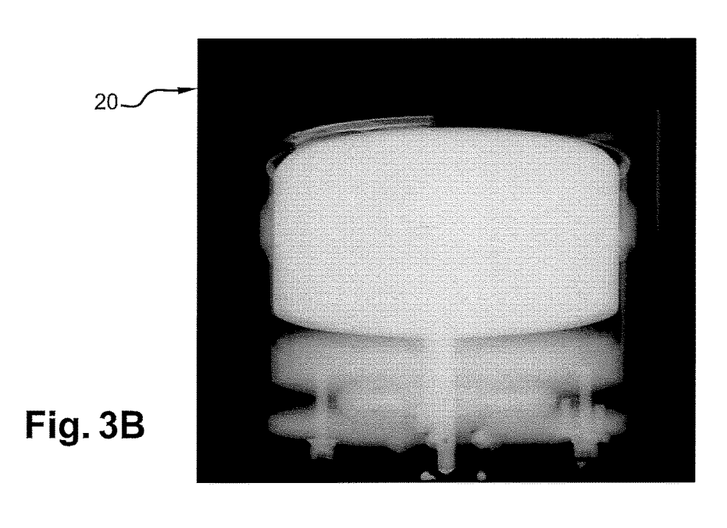

Feedback from experience shows that geometric differences can occur, such as a slight displacement of the crystal in its support, due to the creation of a vacuum during assembly of the sensor. Agreement between the real geometry of the sensor and data supplied by the manufacturer, and particularly sensor drawings, is then checked by taking an X-ray image. For a germanium gamma spectrometer, the density of germanium that is the major constituent of the active part of the sensor makes it necessary to use special high energy X-rays to obtain an image with sufficient resolution. If this is not the case, it will be very difficult if not impossible to interpret data provided on the X-ray, in other words the reading of the exact positions of the components of the sensor and the check on geometric dimensions. Even with a well-resolved image, the effects of parallax make it difficult to obtain a precise reading of dimensions. This difficulty is illustrated on FIGS. 3A and 3B that represent two more or less well defined X-ray images of two examples of hyper-pure germanium sensors marked with references 18 and 20 on FIGS. 3A and 3B respectively. It should be noted that a variation of 2 mm on the length or diameter of the germanium crystal relative to a reference value can modify the detection efficiency by 11% for a measurement point at a distance of 10 cm from the face of the sensor. And the detection efficiency is equal to 0.0222 for a measurement point at 67 mm, and 0.0247 for a measurement point at 71 mm. The error on a survey of dimensions made from an X-day image like those shown on FIGS. 3A and 3B is estimated at 2 mm (see document [3]).

Data that cannot be easily accessed by direct measurements are superposed on these directly measurable dimensions. One problem is the distribution of dopant in the crystal: this dopant can generate losses of the detection efficiency, due to its accumulation. Another problem is the distribution of field lines in the crystal: these field lines also create a loss of detection efficiency since they cannot homogeneously cover the entire crystal. The final problem is the charge collection electronics that also "loses" charges, resulting in a global loss of the detection efficiency.

The influence of these various data varies as a function of the position in space of the radiation source relative to the sensor. This position is defined by the distance from the source to the sensor and by the angle between the straight line joining the source and the sensor and a reference straight line.

It thus becomes difficult to define a geometry for which the response is identical to the response of the real sensor, for all positions in the radiation emission space. For example, information about this subject can be found in the following document:

[5] Model S573/S574 ISOCS/LabSOCS, Validation & verification manual, V4.0, 9231205E.

To overcome these effects, a metrological tie should be made from one or several positions in space, and the observed differences are compensated by integration of a layer called the "dead zone", with the geometry of the crystal. This layer is thus used to compensate for all effects of losses of charge and losses due to field lines and the concentration of dopant in some locations of the crystal. Nevertheless, there is a basic postulate according to which (a) either the dimensions recorded on the X-ray image or the dimensions that are supplied by the manufacture are accurate, and (b) the error made while recording the dimensions is sufficiently small so that there it has no impact on the detection efficiency. However, this condition is not always satisfied. It has been seen that an error of the order of 2 millimeters on one dimension will lead to an error of 11% on the detection efficiency.

PRESENTATION OF THE INVENTION

The purpose of the invention is to overcome the above disadvantages.

Its purpose is a method of quantifying the intrinsic dimensions of a radiation sensor, characterised in that it comprises the following steps:
   definition and production of a model of the sensor, starting from a block diagram of the sensor,
   use a digital calculation to determine influential elements of the sensor, making use of the experience plans theory,
   make measurements, for each particular position in the space around the sensor, using a standard multifrequency (or multienergy) source of said radiation, and
   determine the sizes of elements that influence the sensor response, making use of the experience plans theory, According to one preferred embodiment of the method according to the invention, the step to determine influential elements of the sensor is followed by a verification step using a method of analysing residues, to assure that no influential element has been omitted.

Preferably, the radiation source is rotated around the sensor to make measurements at several angles and at at least one given distance from the sensor.

According to one preferred embodiment of the invention, an attempt is made to find the optimum level of each influential element of the sensor.

Preferably, the generalised reduced gradient method is used to find the optimum level.

According to one particular embodiment of the invention, the source is a standard multifrequency (or multienergy) source with a known activity in order to quantify the intrinsic dimensions of a sensor of said ionizing radiation.

This invention also relates to a device for implementing the method according to the invention, comprising:
   a sensor attachment device adapted to holding the sensor firmly and centring relative to the sensor,
   a reference device adapted to provide a reference point for the measurements,
   a source support device, and
   a pivoting device fixed to the source support device.

According to one preferred embodiment of the device according to the invention, this device also comprises a removable device with adjustable height to hold the sensor attachment device on the floor.

BRIEF DESCRIPTION OF THE DRAWINGS

This invention will be better understood after reading the description of example embodiments given below purely for information and in no way limitative with reference to the appended drawings on which.

DETAILED PRESENTATION OF PARTICULAR EMBODIMENTS

The following describes examples of the dimensioning method according to the invention, and the mechanical device for implementation of this method for quantification of the dimensions of elements that have an influence on the detection efficiency of an ionizing radiation sensor.

Note that all elements necessary to obtain the measurement device are mechanically easy to fabricate. And all tools necessary for the dimensioning method are commercially available or are known in the state of the art.

The invention relates to their association and use.

The required dimensions of elements are obtained as follows:

A geometric model is defined and created in a computer program, starting from the dimensioned block diagram of the ionizing radiation sensor. Such a diagram is shown on FIG. 4 in which the dimensions are expressed in millimeters with an uncertainty of +/−0.2 mm. This uncertainty corresponds to mechanical manufacturing tolerances but not to the positioning uncertainty of elements after installation and assembly. This diagram is sufficient to obtain an idea of the degree of precision and details required for this first step.

Influential elements are determined making use of the experience plans theory that can be used to make a sensitivity analysis. This analysis provides influential elements among the various structural elements making up the sensor. This step is done only by digital calculation: no experience is required.

Measurements are made for different particular positions of the space around the sensor. A precise reading of the measurement coordinates is made. These measurements are made with an emission source of the ionizing radiation considered. This source is a standard multifrequency (or multienergy) source with a known activity expressed in SI units.

The dimensions of elements that influence the sensor response are determined, making use of the experience plans theory, Any type of radiation sensor can thus be calibrated provided that there is a calculation program that can sufficiently precisely reproduce the sensor in three dimensions and the transport of characteristic radiation to be calibrated.

Definitions and the terminology used in the following description of the method to determine elements that have an influence on the sensor response are defined below.

Factors

Factors are the parameters of the studied system. In this case, they correspond to characteristic elements of the sensor that have a direct influence on the response of the sensor. The factors are set to different values during an experience plan.

Levels

Factors determined for the experience plan vary over a study domain. They can vary continuously and can be equal to an infinite number of possible values, or discretely and be equal to one of a finite number of chosen values. These are the different levels of a factor. The factors used for the purposes of this invention are limited to three possible levels: the upper and lower bounds of the domain and the median value between these bounds.

Response(s)

A response is an output magnitude, or a function of an output magnitude that is provided by a test.

Behaviour Model

This is a mathematical model that gives the response as a function of the factors. Processing of data derived from an experience plan consists of studying the difference between the results announced by the model (predicted results) and experimental results obtained after a series of tests.

We will now consider the determination of factors that have an influence on the sensor response.

This determination is created using the experience plans theory. However, unlike the "classical" use of experience plans, we do not attempt to define a behaviour model but rather to optimize parameters, namely the dimensions of components of the sensor.

Creating an experience plan effectively means defining the set of tests, namely the set of combinations of factors and levels that must be done to study the influence of each factor on the sensor response. A screening plan is a so-called 'reduced" plan because it does not require that all possible combination of factors and levels are made for the study considered. A screening plan consists of selecting several combinations representative of a global study of factors. It naturally reduces the execution time of a plan, but on the other hand it reduces information available about the behaviour of the system.

Use of this of type of plan identifies which elements have the most influence on the sensor response and evaluates the potential variation bounds of each factor. There is no need to precisely quantify these influences with this first plan. Finally, it provides a "scan" of all factors. This plan also determines which factors have the most influence on each other. And it is important to clearly dissociate the influence of factors on responses and the correlation of factors, in other words the influence of factors on each other.

Specifically, the first step is to list factors to be introduced into the experience plan and then to specify the values of levels of these factors. The remainder of the method depends on responses provided by the screening plan.

Figure 4:
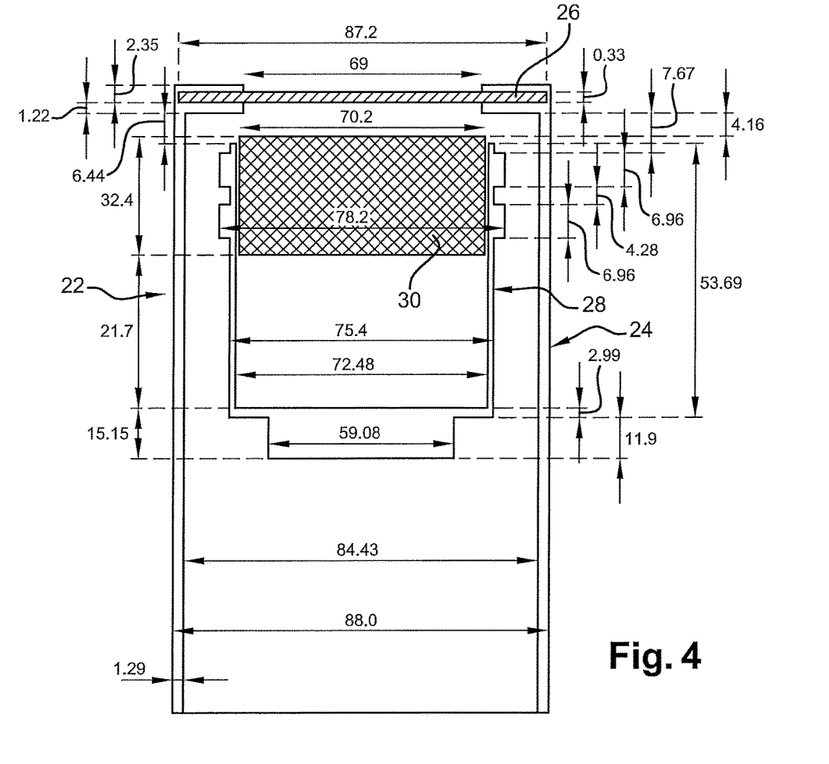

For a germanium sensor, the list of factors is given by the dimensioned block diagram supplied by the sensor manufacturer. For example, with reference to FIG. 4 on which dimensions of the sensor 22 are expressed in millimeters, these factors may be:

the length and diameter of the cover 24;

the diameter and thickness of the input window 26;

the thickness and diameter of the germanium crystal support 28;

the length and diameter of the crystal 30, and the length and diameter of the of the "contact pin" if the crystal has a contact pin;

the thicknesses of the "equivalent dead zones" located in front of, at the sides of and behind the germanium crystal.

The variation bounds associated with these factors will for example be the measurement errors that are estimated during their quantification.

This step is done entirely digitally. Once the factors to be studied and their levels have been determined, and the geometry of the sensor has been modelled, the sensor response (the detection efficiency) is calculated for each configuration required by the "scan" plan. The spectral line associated with each detection efficiency must be integrated.

These responses are then analysed by an experience plan processing software, for example the LUMIERE software (SOFT16, LUMIERE, version 5.49). This software then provides the sensitivity analysis directly and identifies elements that have an influence on the sensor response to be considered. This software can also validate the fact that all phenomena that influence the sensor response are well identified and that none have been omitted. This validation is made by analysing residues. A high value of residues indicates that not all factors that influence the response have been included in the experience plan.

The analysis made on hyper-pure germanium sensors demonstrated that 99.60% of the sensor response is explained by five factors (the length and diameter of the crystal, and the three "equivalent dead zones" located at the front, the back and the side respectively) for a point at 10 cm in front of the detector, and 92% is explained by these same factors for a point located at 10 cm, at 90° from the axis of the detector.

We will now consider measurements made for determination of the spatial response of the sensor.

Measurements of the spatial response of the sensor have to be made in particular geometric positions, to dimension the influential elements described in the above. These measurements must be made with a radiation source considered to be a point source, in other words a source that can be considered like a geometric point for the sensor. In particular, this condition must be satisfied so that two measurements made at two different points in space do not interfere with each other; a geometric intersection of radiation emissions is not wanted.

A device used to satisfy the above conditions is disclosed in the following document that should be referred to:

[6] ISOCS/LabSOCS, Detector characterization report, ACK#0402896, Detector S/N 605021, Nov. 3, 2004.

Figure 5:
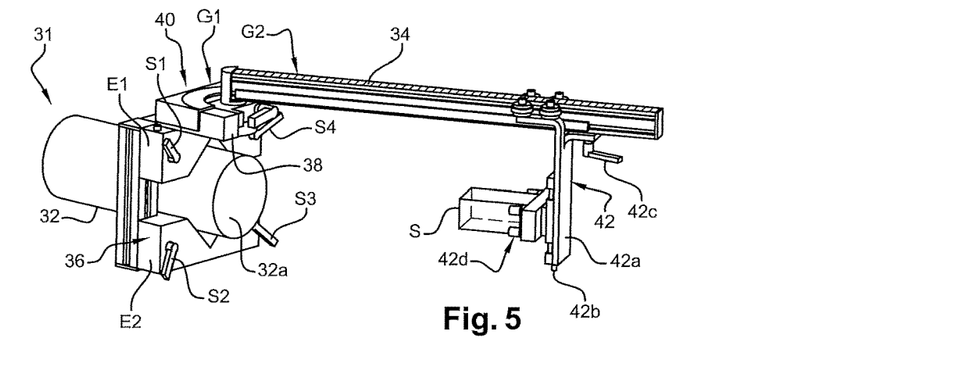
FIG. 5 is a perspective diagrammatic view of one particular embodiment of the device according to the invention.
Figure 6:
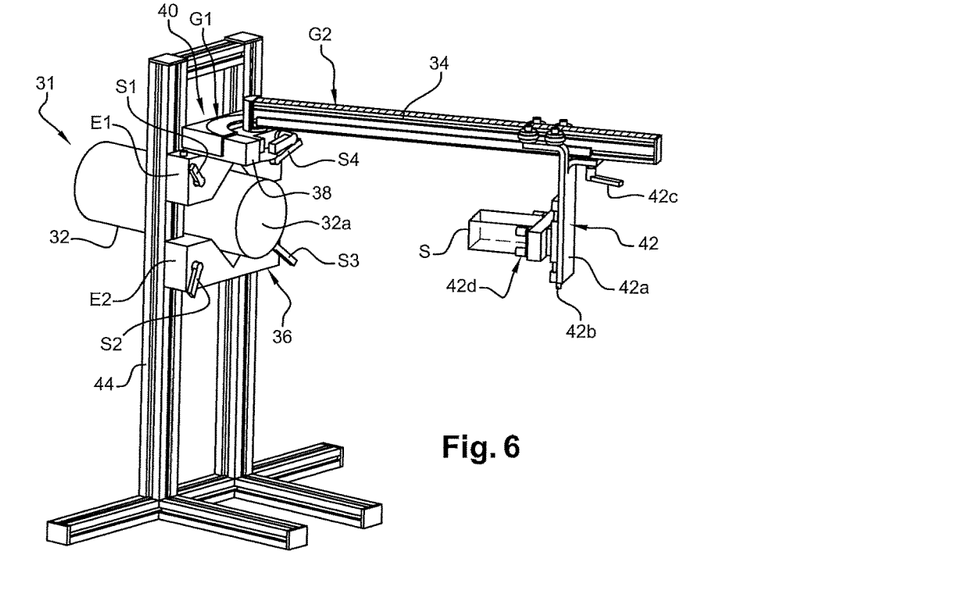
FIG. 6 is a perspective diagrammatic view of a variant embodiment of the device shown on FIG. 5, FIGS. 7A, 7B and 7C diagrammatically illustrate different known geometries for ionizing radiation sensors.

FIG. 5 shows a diagrammatic perspective view of an example of a device according to the invention, for acquisition of the spatial response of a radiation sensor 31 using a source S of said radiation. This source is a standard multifrequency (or multienergy) source. FIG. 6 diagrammatically illustrates a variant of FIG. 5, in which the device in FIG. 5 is complemented by a holding down device maintaining contact with the floor, adjustable in height.

On FIG. 5:
reference 32 denotes the sensor cover,
reference 34 denotes an arm,
reference 36 denotes an attachment device with two brackets, in which the two brackets are marked as references E1 and E2,
reference 38 denotes an upper plate,
reference 40 denotes a turret,
reference 42 denotes a source holder,
reference 42a denotes an adjustment plate,
reference 42b denotes a tightening device,
reference 42c denotes a blocking device,
reference 42d denotes a set of four retaining pins, only three of which are visible on FIG. 5, for holding the source S on the source holder 42, and
references S1, S2, S3 and S4 denote tightening devices.

These references are repeated on FIG. 6 on which a holding down device 44 maintaining contact with the floor is also shown, that is adjustable in height and holds the device on FIG. 5 on the floor.

In the example given purely for information and in no way limitative, the entire device (that does not include the sensor with its cover), without is floor holding down device, has a maximum mass of 4 kg, for a length of the arm 34 equal to 50 cm (but this length could be reduced for example to 30 cm, if the maximum mass concerned does not cause excessive stress on the sensor). This retaining device is removable. It advantageously completes the principal device in FIG. 5. It reduces the force imposed by the torque of the arm 34 when the source holder 42 is at the end of the arm and the cover 32 of the sensor cannot resist such a torque.

The device in FIG. 5 essentially comprises the attachment device with two brackets 36, the upper plate 38, the turret 40 and the source holder 42.

The attachment device with two brackets 36 is adjusted on the cover 32 of the sensor 31. The acquisition device is retained on the cover 32 by four tightening devices S1, S2, S3 and S4 that firmly press the two brackets E1 and E2 in contact with the cover 32. The attachment device with two brackets advantageously holds the acquisition device firmly on the cover 32 of the sensor 31 and provides reliable systematic centring of the acquisition device relative to the front face of the cover 32, for any geometry of the sensor.

Such an arrangement enables firm retention and better reproducibility of measurements than the device disclosed in document [6].

The upper plate 38 supports a cleat (not shown) and the turret 40. The cleat that may or may not be removable is fixed on the plate 38, and advantageously can be used to adjust the end of the arm 34 with the end of the front face 32a of the cover 32 of the sensor 31. It thus provides the zero reference point for the acquisitions.

The turret 40 receives the end of the arm 34 to retain the source holder 42. This end is slaved; it must be located in the plane defined by the front face 32a of the cover 32.

The turret 40 can pivot around 360°. However, the amplitude of this movement will be limited by the sensor 31. An angular graduation G1 records the angle marked by the arm 34 relative to the plane of the front face of the sensor cover. Furthermore, a graduation G2 on the arm 34 records the distance between the front face of the sensor cover and the radiation source S, that is positioned in the source holder 42.

This enables reproducible multi-positioning with a precise angle and distance measurement, which is not the case for the system disclosed in document [6]. This also advantageously enables the use of intermediate calibration verification points, in positions different from the positions used for the calibration, which is not the case for the device disclosed in document [6].

The height of the source holder 42 can be adjusted using the plate 42a and the clamping device 42b. This adjustment adjusts the height of the geometric centre of the emission source to match the geometric centre of the cover of the sensor 31. The plate 42a is adjusted to the right distance along the arm 34, by the locking device 42c. The four pins of the assembly 42d can be adjusted and blocked so as to retain the radiation source S. The assembly 42d is used to hold several geometric types of radiation sources, provided that the dimensions of these sources are compatible with the useful space between the retaining pins.

The adjustment to all types of detector covers and to different types of source geometries is an advantageous characteristic of the invention, that is not disclosed in document [6].

Measurements necessary for dimensioning are made through the acquisition device described above, and are preferably made at three different angles (0°, 45° and 90°), for three different distances (10 cm, 20 cm and 30 cm). And the minimum required configuration is one measurement at a distance of 30 cm, at three different angles (0°, 45° and 90°).

Special care must be paid to the number of spectral lines used, so as to guarantee a good definition of the sensor response. This response is expressed in the following form:

detection efficiency=$f$(spectral line)

For the detection of gamma radiation, if the spacing between energy samples (spectral line) is too large, especially at low energies, then the detection efficiency varies strongly at these energy levels, the definition of the sensor response will not be sufficient to size the influential elements correctly and thus validate the response provided by digitization of the sensor.

It should be noted that the acquisition device disclosed in document [6], does not guarantee centring of the source with the geometric centre of the front face of the sensor cover, nor centring of the source with the centre of the cover. Not can it be used to make different dimensioned measurements at different distances from the front face of the cover.

We will now consider the dimensioning of elements that influence the sensor response.

This dimensioning is done using a complete factorial plan. This experience plan category will supply the most complete information possible about systems with a restricted number of factors that form influence factors. A complete plan consists of testing all possible combinations of factors and the levels of each.

Influences put forward during the screening plan are used to make a direct selection of the factors used for the complete plan. It is important to take the precaution of only keeping a limited number of factors, the number of levels remaining the same as in the screening plan because in this case all possible combinations have to be made.

Let $f$ be the number of factors and $n$ the number of levels; the experience plan is then composed of $N=n^f$ tests.

Although the number of levels remains the same, the values of each of the levels can be adjusted as a function of the results of the screening plan.

The new values of levels must be sufficient to size the elements of the sensor (real), the factors of which are dimensions. The analysis of the results quantifies the value of the factor for the sensor (real) for each factor.

The input data for this experience plan are:
the distance at which the measurement was made,
the angle at which the measurement was made,
the energy considered,
the experimental detection efficiency $\varepsilon_{exp}$, calculated as the ratio of the net area present in the spectrum at the energy considered, to the number of radiation events emitted by the source at the energy considered, according to the calibration certificate,
the values of influence factors defined by the complete experience plan for the four previous data, fixed at specific values,
the digital detection efficiency $\varepsilon_{McNP}$, calculate by the calculation program from the geometry of the sensor, defined by the block diagram given by the manufacturer and by the values of influence factors, defined in the previous paragraph.

For example, the MCNP calculation program is used. For example, information about this subject can be found in the following document:
[7] Los Alamos National Laboratory, MCNPX User's manual, LANL, v. 2.5, 2005

The response of the experience plan for the input data is:

$$\hat{\varepsilon} = \frac{\varepsilon_{McNP} - \varepsilon_{exp}}{\varepsilon_{exp}}$$

Unlike current practices, it is essential not to use the absolute value of the response and to keep the sign of the response. Otherwise, a bias would be introduced that would distort the final dimensioning of elements.

The resulting experience plan is then composed of sets of data in which tests are made (5 factors at 3 levels) for each measurement made at a distance d and an angle $\vartheta$, and for each energy of interest $E_i$, $3^5=243$. The purpose of each of these tests is to evaluate the value of $\varepsilon_{McNP}$ that is associated with the test considered. A test corresponds to a configuration (dimensions of elements) in which the factors are blocked at one of their levels. Since there are 12 energies of interest in the example considered, the total number of values of $\hat{\varepsilon}$ used for a measurement position is equal to 12×243, namely 2916. Since the example considered contains 9 measurement points (in other words 9 (d, $\vartheta$) pairs), the final number of values of $\hat{\varepsilon}$ used for the complete plan is equal to 2916×9, namely 26244.

And since there are 9 measurement points for 12 energies of interest, the result obtained is 9×12, namely 108 responses.

In the case considered, the LUMIERE software that is discussed above is limited to the simultaneous treatment of 15 responses. This limitation is overcome by making one experience plan for each energy of interest, resulting in 12 experience plans. The response required from each of these experience plans results in a linear type model. It is given by the following equation (1):

$$\hat{\varepsilon}=Cte+a\cdot L+b\cdot\Phi+c\cdot Zma+d\cdot Zmc+e\cdot Zmf+f\cdot L^2+g\cdot\Phi^2+h\cdot Zma^2+i\cdot Zmc^2+j\cdot Zmf^2$$

For example, model coefficients are obtained using the least squares method as used by the LUMIERE software.

Such a response cannot be used to quantify the required dimensions, these responses have to be used to search for the optimum level of each factor for a given value of the requested response. For example, this optimum level can be given by the "generalised reduced gradient" method as used by the LUMIERE software. In this case, the condition to be satisfied to solve the system of equations resulting from this method is that the responses $\hat{\varepsilon}$ associated with the 12 energies of interest tend towards 0, so as to minimize the error between simulated values and experimental values.

The use made of experience plans and the association of responses to the generalised reduced gradient method form one of the innovative aspects of the invention for the dimensioning of elements for which the geometric dimensions have an impact on the digital response of the sensor.

Note that this method has many advantages:
1. It avoids the need for precise dimensional readings that are difficult to obtain.
2. It avoids the use of a particular non-destructive imagery technique. These first two points have a clear advantage over prior art in which the use of high resolution X-ray imagery is a routine practice to obtain the precision necessary for the definition of a digital model (however with errors larger than errors that occur when this invention is used).
3. If the block diagram does not correspond to reality, this is quickly detected because the experience plan processing software will not find any behavioural model.

Any factor affected by this error will be quickly identifiable because the value assigned to this factor will be the maximum or minimum level of the factor considered. This will give some information about the cause of the difference between the real model and the block diagram provided. Such checks are impossible with methods according to prior art and calibration errors can occur.

4. If an error is made on the activity of the radiation source, this error will be detected, as explained below. Once again, such a verification cannot be made with methods according to prior art, which is the source of other possible calibration errors.

5. Sensors fabricated in series and of the same type only require the production of a complete experience plan once. Such sensors will all have the same characteristics (influence factors and levels of these factors). Thus, any new sizing of the same sensor or a similar sensor will only require that spatial response measurements are made and will be quantified almost instantaneously, in a time equal to the calculation time of the experience plan software. Such a procedure takes more than a month at the present time. Thus, with the invention, industrial series processing can be used instead of case-by-case processing.

6. The above point means that any operator can determine the dimensions, and a specialist is no longer necessary. This work can also be done as many times as is considered necessary and especially in any location (particularly in a laboratory, adjacent to the sensor production line, in the field, outdoors). This is not possible with any method according to prior art.

We will now consider validation of the digital model that is dimensioned using the method according to the invention.

The procedure described below can give an automated alert of possible errors that might have occurred during use of this procedure. Potential sources of errors considered herein are the error on the activity of the standard source used, the error on the position of the source during the measurements and the dimensioning error on the block diagram.

This type of error can be detected by three different indicators, given by the method according to the invention:

1. the value of residual standard deviations on equation (1) associated with each response.

A high value, for example of more than 50%, indicates that the response is not explained by the factors and therefore that the value of the detection efficiency cannot be explained by the factors.

2. the prediction of the model in comparison with experimental data.

For example, the target value is a prediction of less than 5%. This means that the behaviour model returns the value of the detection efficiency with a difference of less than 5% from the measured experimental value for the same point. If the value is higher than this target, the expected metrological accuracy has not been achieved.

3. optimised values of factors.

If several of these values are equal to the maximum bound or the minimum bound, this means that an optimum behaviour model cannot be evaluated.

Table I below summarises the above indicators 1, 2 and 3, so that the origin of the alert on a potential error committed during digital dimensioning of the sensor can be found.

Therefore these alerts help to assure that the method of dimensioning elements that influence the response is optimal and that the optimised values provide by this method give a guaranteed quantification of the detection efficiency, within a convergence criterion (5% in the example).

For each case, the applied methodology is capable of identifying the error and its source:

main impact on indicators 1, 2 and 3 for a dimensional error on the block diagram, main impact on indicators 2 and 3 for an error on the activity of the source, impact on indicator 1 for a source positioning error.

TABLE I summary of indicators on the accuracy of the digital dimensioning of the sensor

| Indicator | Error on the activity of the source | | | Error on the position of the standard source 50% (=7 cm at 121.78 keV for a reference point at 10 cm) | Real detector dimensions outside values of levels defined according to the manufacturer's diagram 6% error (4 mm) on the diameter given by the manufacturer's diagram and 13% (4 mm) on the crystal height (also manufacturer data) |
|---|---|---|---|---|---|
| | 10% error | 20% error | 50% error | | |
| 1 | Insignificant effect | Insignificant effect | Significant: all values doubled for all of the 12 values associated with energies | Significant: Values multiplied by a factor of 2 to 10 for all 12 models associated with the 12 responses | Significant: Values multiplied by a factor of 2 to 10 for all 12 models associated with the 12 responses |
| 2 | Not very significant 2 predicted values are above the target | Not very significant 2 predicted values are above the target | Significant All predicted values are above the target by a factor of about 10 | Non significant 3 predicted values are just above the target | Significant 8 predicted values out of 12 are above the 5% target |
| 3 | Insignificant effect | Significant effect All optimised values are at the minimum or maximum bounds | Significant effect All optimised values are at the minimum or maximum bounds | Insignificant effect | Significant effect 3 values out of 5 are optimized. The 2 values that are not optimized are the diameter of the crystal and the dimensioned dead zone. |

The conclusions mentioned in Table I are derived from the analysis made above.

We will now describe the operating software for the dimensioning method. This software can automate all steps and particularly make it possible for an unskilled operator to create a digital model of the sensor, rather than requiring specialists in the technical field considered.

To achieve this, such software must:
- ask for the number of measurements to be made and the distances and the angle at which they are made, and ask what energies of interest will be used,
- generate the list of measurements to be made,
- retrieve net areas of total absorption peaks in the spectra for each energy of interest,
- evaluate the experimental detection efficiency for each energy of interest, starting from nuclear data and the activity of the connected standard source,
- for each type of sensor for which a generic model has been defined in the computer program, be able to include the dimensions of elements to be dimensioned into the predefined digital model, as input by the operator from the block diagram given by the manufacturer,
- generate the scan experience plan in an automated procedure, if the objective is to define elements that influence the response,
- generate digital models corresponding to the energies of interest and to measurement points, and extract the results of the computer program,
- perform the sensitivity analysis to determine parameters that influence the sensor response,
- once these parameters have been evaluated, prepare the corresponding complete experience plan,
- generate digital models corresponding to the energies of interest and to measurement points, and extract the results of the computer program,
- calculate responses from experimental and digital detection efficiencies, and optimize dimensions to provide the optimum digital model.

Stop points affecting any source activity errors will be included. They will thus be able to alert the operator about the quality of the calibration made on line.

We will now consider the qualification of the measurement device.

The method according to the invention has been validated using the calibration thus made to quantify the activity of a connected standard source that is different from those used for calibration, by its nature, activity and position.

It has also been validated by comparing the results of measurements made on reference objects, with a calibration made using a method according to the invention, and the results of measurements made on the same objects, with a commercial calibration. The validity of this commercial calibration is guaranteed by document [5] and by the following document:

[8] ITECH Instruments, User's manual, Winner Track, 2009.

Table II below shows normalised differences, in percentages, between the experimental efficiency determined from measurements, and the detection efficiency provided by commercial calibrations and by the method according to the invention.

Figure 7A:
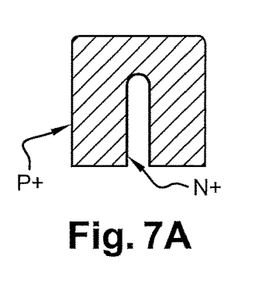
Figure 7B:
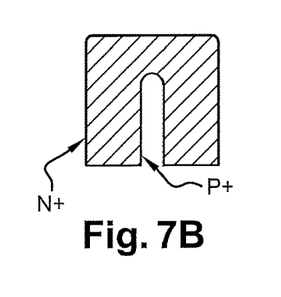
Figure 7C:
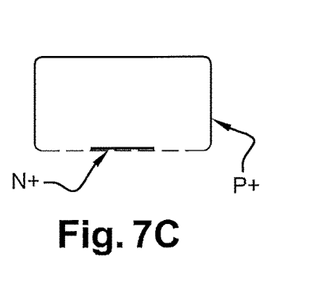

Different sensor geometries known in the state of the art, are summarised in FIGS. 7A, 7B and 7C that show an N type germanium well sensor, a P type germanium well sensor, and a plane type germanium sensor, respectively. N+ type zones and P+ type zones are marked on these figures.

TABLE II

Comparative table showing differences between a commercial calibration and a calibration made using a method according to the invention

| | Plane type detector 1 | | Well type detector | |
|---|---|---|---|---|
| | Characterization by the CANBERRA company | Characterization by method according to the invention | Characterization by the ITECH company | Characterization by method according to the invention |
| Average error in % (on 30 points) | 4.08 | 3.54 | 5.9* | 3.53 |
| standard deviation (1σ) | 4.31 | 2.76 | 16.25* | 3.04 |

*These digital values are explained by a very large difference between experiment and model at low energies (53 keV to 121 keV), for angular distributions of between 45° and 90°.

The sensor must be calibrated when the measurement is made with the objective of quantifying the required magnitude. This is also valid when the sensor is a spectrometric type sensor.

The use of a computer program or an analytic calculation for this quantification improves the flexibility of use of these sensors. This flexibility makes it possible to perform non-destructive tests, particularly in the field. This specific feature is now used routinely and it is essential for the quantification of any contamination that might be present on many objects such as technological waste, and for which it is impossible or at least difficult to perform destructive tests.

In this case, calibration of the sensor, in other words determining its response in space, is a crucial step for coupling with the calculation. At the present time, this step can only be done by expert personnel and it is complicated, and it is difficult to evaluate its metrological accuracy. These difficulties mean that only a few companies are capable of making such calibrations, more or less accurately.

With the device and the method according to the invention, this step can be automated, guaranteeing the metrological robustness of the calibration thus made. With the invention, any company and any operator will be capable of making this calibration, regardless of the place at which it is done.

Examples of the invention given above apply to ionizing radiation sensors. But the invention is not limited to this type of sensor: it is applicable to all types of ionizing and non-ionizing radiation sensors. And an expert in the subject will easily be able to adapt the examples given above to such sensors.

The invention claimed is:

1. A method of quantifying dimensions of components of a radiation sensor, comprising:
defining and producing a model of the radiation sensor, using estimated dimensions of the components;
identifying, among the components, influential components which influence a response of the radiation sensor, by selecting plural combinations of dimensions of potential influential components and analyzing a computed response of the radiation sensor for each of the selected combinations;
making measurements, using the radiation sensor, for several positions of a calibrated multi-frequency source around the radiation sensor, the positions corresponding to the identified influential components; and
determining corrected dimensions of the influential components based on a computed match between the model and the measurements.

2. A method according to claim 1, wherein the identifying the influential components of the radiation sensor is followed by a verification using a value of residual standard deviations of theoretical models associated with each of the plural combinations, to determine whether any influential component has been omitted.

3. A method according to claim 1, wherein the calibrated multi-frequency source is rotated around the radiation sensor to make measurements at plural angles and at least one given distance from the radiation sensor.

4. A method according to claim 1, further comprising determining the corrected dimension of each influential component of the radiation sensor such that a ratio of a difference between an experimental detection efficiency and a numerical detection efficiency, to the experimental detection efficiency is minimized.

5. A method according to claim 4, wherein a generalized reduced gradient method is used to find the corrected dimension of each influential component.

6. A method according to claim 1, wherein the calibrated multi-frequency source is a calibrated multi-frequency source of ionizing radiation with a known activity.

7. A device for implementation of a method of quantifying dimensions of a radiation sensor, comprising:
an attachment device for attaching the radiation sensor, including two flat square brackets adapted for holding the radiation sensor firmly, and for centering relative to the radiation sensor;
a reference device configured to provide a reference point for measurements;
a support device for supporting a source of radiation;
a pivoting device fixed to the support device for supporting the source of radiation; and
a computer configured to
identify, among components of the radiation sensor, influential components which influence a response of the radiation sensor, by selecting plural combinations of dimensions of potential influential components and analyzing a computed response of the radiation sensor for each of the selected combinations using estimated dimensions of the components; and
determine corrected dimensions of the influential components based on results provided by a model of the radiation sensor and on results of measurements performed using the radiation sensor, for each of plural positions of the source around the radiation sensor, the positions corresponding to the identified influential components.

8. A device according to claim 7, further comprising a removable device with adjustable height to hold on a floor the attachment device for attaching the radiation sensor.

9. The method according to claim 1, wherein the radiation sensor is an ionizing radiation measurement spectrometer.

* * * * *